(12) United States Patent
Kim

(10) Patent No.: US 8,750,064 B2
(45) Date of Patent: Jun. 10, 2014

(54) SEMICONDUCTOR MEMORY APPARATUS

(75) Inventor: So Jeong Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 229 days.

(21) Appl. No.: 13/340,926

(22) Filed: Dec. 30, 2011

(65) Prior Publication Data

US 2013/0128681 A1     May 23, 2013

(30) Foreign Application Priority Data

Nov. 21, 2011    (KR) ........................ 10-2011-0121703

(51) Int. Cl.
     *G11C 7/02*      (2006.01)

(52) U.S. Cl.
     USPC ........................................................ 365/207

(58) Field of Classification Search
     USPC ........................................................ 365/207
     See application file for complete search history.

(56) References Cited

U.S. PATENT DOCUMENTS

| | | | |
|---|---|---|---|
| 7,154,788 B2 * | 12/2006 | Takemura et al. ....... | 365/189.05 |
| 7,257,034 B2 * | 8/2007 | Takemura et al. ....... | 365/189.05 |
| 7,260,006 B2 * | 8/2007 | Lee ............................... | 365/203 |
| 8,451,680 B2 * | 5/2013 | Shim ........................ | 365/230.06 |
| 2002/0001248 A1 * | 1/2002 | Ku ............................... | 365/222 |
| 2006/0215479 A1 * | 9/2006 | Lee ........................... | 365/230.06 |
| 2006/0221666 A1 * | 10/2006 | Kang et al. .................... | 365/149 |
| 2008/0205185 A1 * | 8/2008 | Shim ........................ | 365/230.03 |
| 2008/0259692 A1 * | 10/2008 | Hong ....................... | 365/189.04 |
| 2010/0302878 A1 * | 12/2010 | Kang ....................... | 365/189.09 |
| 2011/0249523 A1 * | 10/2011 | Shim ............................ | 365/203 |

FOREIGN PATENT DOCUMENTS

| KR | 10-2009-0076145 A | 7/2009 |
|---|---|---|
| KR | 10-2011-0000141 A | 1/2011 |

* cited by examiner

*Primary Examiner* — Huan Hoang
*Assistant Examiner* — Pablo Huerta
(74) *Attorney, Agent, or Firm* — William Park & Associates Patent Ltd.

(57) ABSTRACT

A semiconductor memory apparatus includes a first switch, a second switch and a control unit. The first switch couples/separates a first bit line and a sense amplifier to/from each other in response to a first bit line separation signal. The second switch couples a second bit line and the sense amplifier to each other in response to a second bit line separation signal. The control unit generates a bit line separation signal for a refresh operation, of which enable period is shorter than that of the second bit line separation signal, and provides the generated bit line separation signal for the refresh operation to the second switch in the refresh operation.

18 Claims, 4 Drawing Sheets

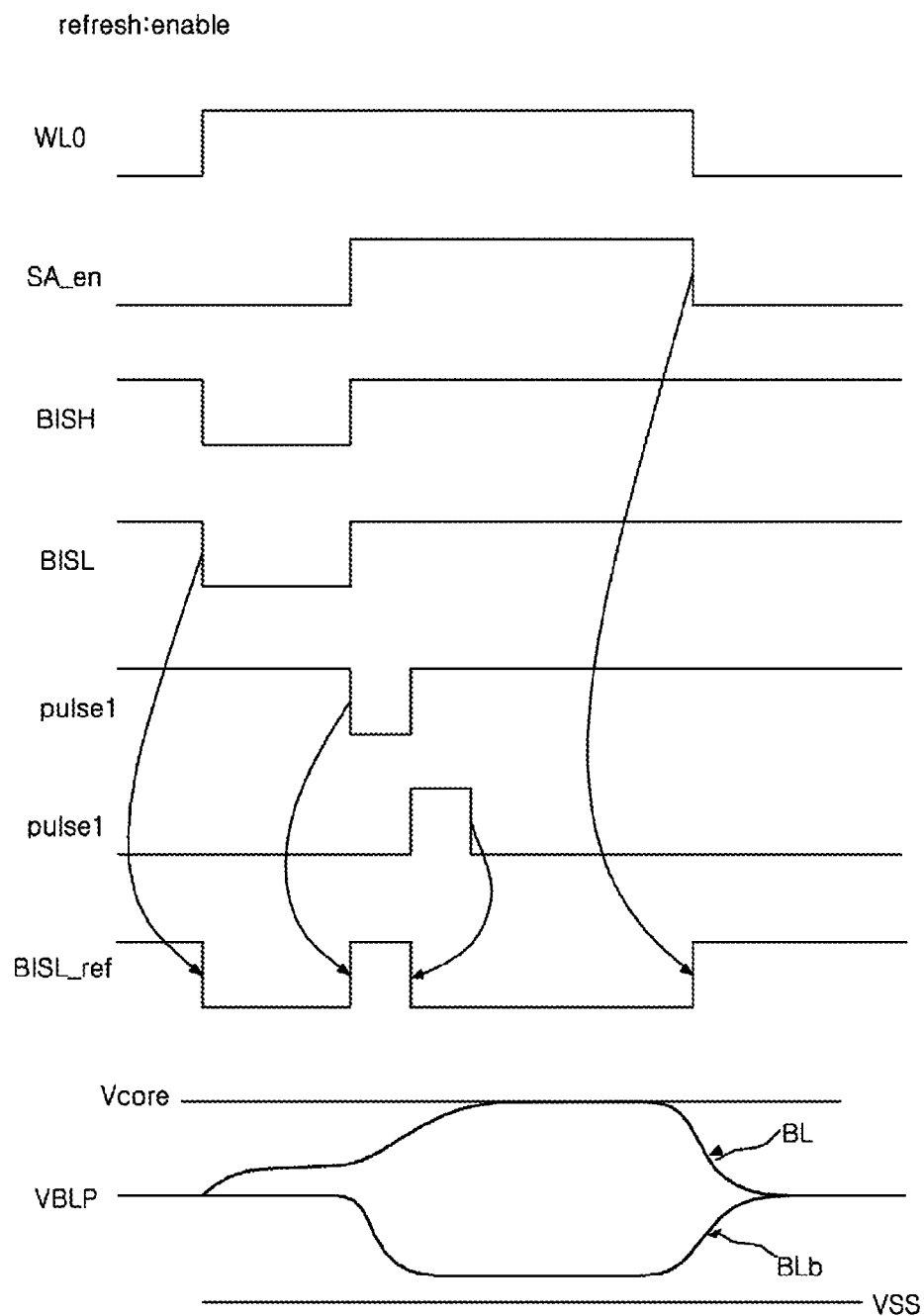

SEMICONDUCTOR MEMORY APPARATUS

CROSS-REFERENCES TO RELATED APPLICATION

The present application claims priority under 35 U.S.C. §119(a) to Korean application number 10-2011-0121703, filed on Nov. 21, 2011, in the Korean Intellectual Property Office, which is incorporated herein by reference in its entirety.

BACKGROUND

1. Technical Field

The present invention relates generally to a semiconductor integrated circuit, and more particularly to a semiconductor memory apparatus.

2. Related Art

A semiconductor memory apparatus refers to an apparatus that can store data and output the stored data in response to a request from a controller. More specifically, the semiconductor memory apparatus stores data using, for example, one transistor and one capacitor as a unit cell.

Since a known semiconductor memory apparatus such as a DRAM stores data using charging/discharging of a capacitor, the capacitor should be recharged at every predetermined time. In this case, the operation of recharging at every predetermined time is referred to as a refresh operation.

SUMMARY

A semiconductor memory apparatus capable of reducing current consumption in a refresh operation is described herein.

In one embodiment of the present invention, a semiconductor memory apparatus includes a first switch configured to connect/separate a bit line and a sense amplifier to/from each other in response to a first bit line separation signal, a second switch configured to connect a bit line bar and the sense amplifier to each other in response to a second bit line separation signal, and a control unit configured to generate a bit line separation signal for refresh, of which enable period is shorter than that of the second bit line separation signal, and provide the generated bit line separation signal for refresh to the second switch in a refresh operation.

In another embodiment of the present invention, a semiconductor memory apparatus includes a bit line, a bit line bar, a sense amplifier, and a control unit configured to connect one selected from the bit line and the bit line bar to the sense amplifier during a period when the sense amplifier is activated, and connect the other selected from the bit line and the bit line bar to the sense amplifier during a period shorter than that when the sense amplifier is activated, in a refresh operation.

In still another embodiment of the present invention, a semiconductor memory apparatus includes a first bit line configured to provide data of a first mat when a first word line is enabled, a second bit line configured to provide data of a first mat when a second word line is enabled, a sense amplifier configured to sense and amplify voltage levels of the first and second bit lines in response to a sense amplifier enable signal, a first switch configured to connect the first bit line and the sense amplifier to each other when a first bit line separation signal is enabled, a second switch configured to connect the second bit line and the sense amplifier to each other when a second bit line separation signal is enabled, and a control unit configured to disable the first and second bit line separation signals until the word line is enabled and the sense amplifier enable signal is enabled, enable the first and second bit line separation signals when the sense amplifier enable signal is enabled, disable the enabled second bit line separation signal after a predetermined time elapses, and enable the second bit line separation signal when the sense amplifier enable signal is disabled, in a refresh operation.

In still another embodiment of the present invention, a semiconductor integrated circuit includes a line configured to transmit a signal, an amplification unit configured to sense and amplify an input voltage during an enable period of an enable signal, a switch configured to input a voltage of the line as the input voltage to the amplification unit when a control signal is enabled, and prevent the voltage of the line from being inputted to the amplification unit when the control signal is disabled, and a control unit configured to enable the control signal when the enable signal is enabled, and generate the control signal of which enable period is shorter than that of the enable signal, in a specific operation mode.

BRIEF DESCRIPTION OF THE DRAWINGS

Features, aspects, and embodiments are described in conjunction with the attached drawings, in which:

FIG. 5 is a timing diagram of a semiconductor apparatus to which the control unit is applied according to an embodiment of the present invention.

DETAILED DESCRIPTION

Hereinafter, a semiconductor memory apparatus according to the present invention will be described below with reference to the accompanying drawings through exemplary embodiments.

Figure 1:
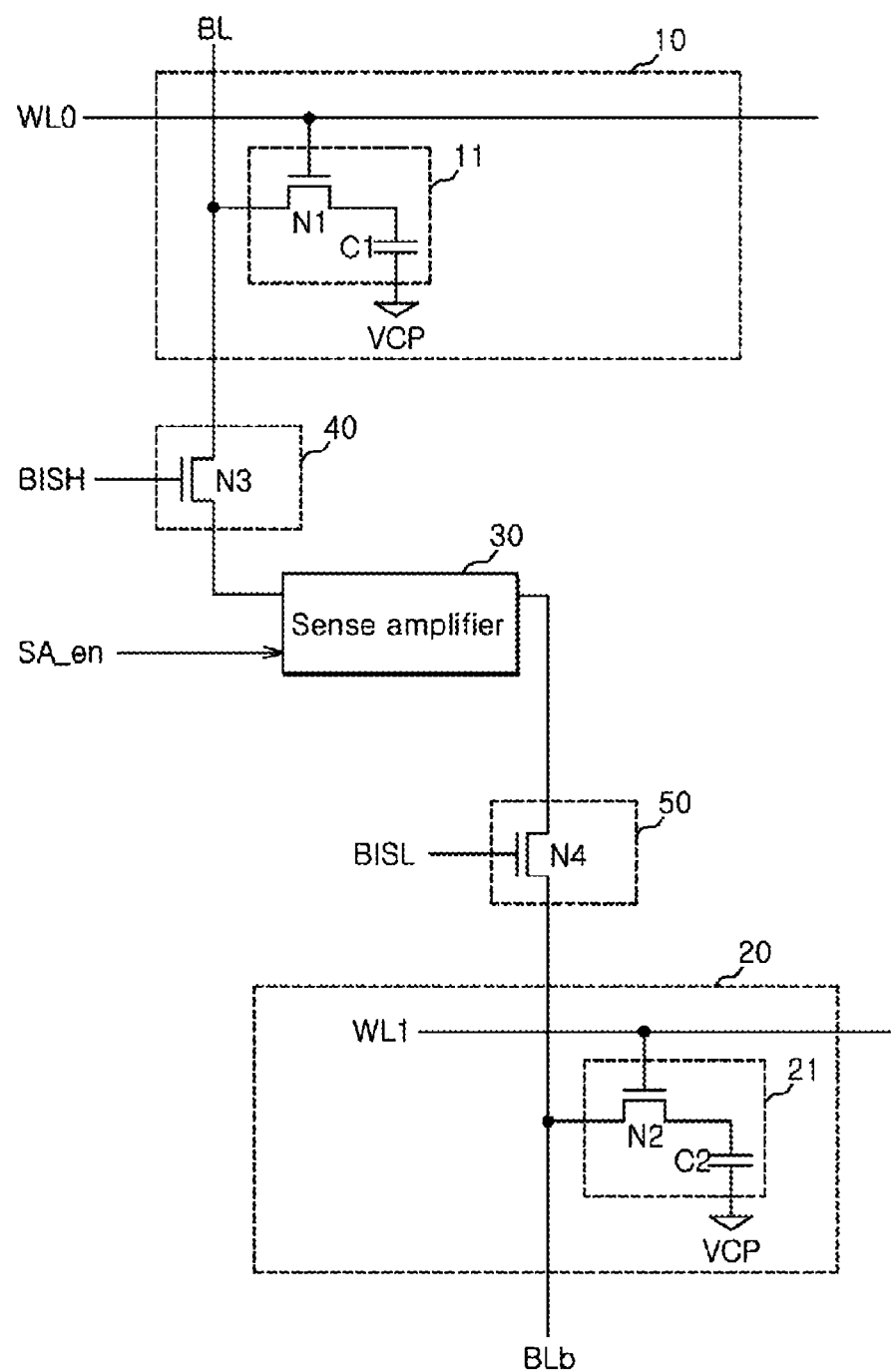
FIG. 1 is a configuration diagram of a semiconductor memory apparatus according to an embodiment of the present invention.
Figure 2:
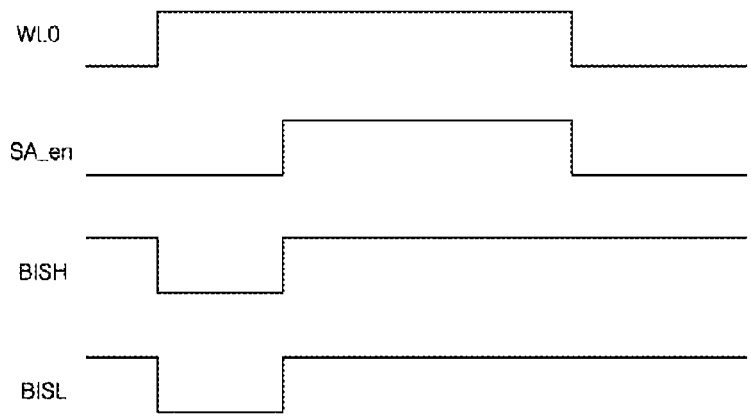
FIG. 2 is a timing diagram of the general semiconductor memory apparatus.

FIGS. 1 and 2 are configuration and timing diagrams of a semiconductor memory apparatus including a configuration for a refresh operation.

The semiconductor memory apparatus includes a first mat 10, a second mat 20, a sense amplifier 30, a first switch 40 and a second switch 50.

The first mat 10 includes a first memory cell 11 for storing data. The first memory cell 11 includes a first transistor N1 and a first capacitor C1. A first word line WL0 is connected to a gate of the first transistor N1, a bit line BL is connected to a drain of the first transistor N1, and one end of the first capacitor C1 is connected to a source of the first transistor N1. A cell plate voltage VCP is applied to the other end of the first capacitor C1. In this case, the first mat 10 includes a plurality of memory cells.

The second mat 20 includes a second memory cell 21 for storing data. The second memory cell 21 includes a second transistor N2 and a second capacitor C2. A second word line WL1 is connected to a gate of the second transistor N2, a bit line bar BLb is connected to a source of the second transistor N2, and one end of the second capacitor C2 is connected to a source of the second transistor N2. The cell plate voltage VCP is applied to the other end of the second capacitor C2. In this case, the second mat can include a plurality of memory cells.

The sense amplifier 30 senses and amplifies voltage levels of the bit line BL and the bit line bar BLb.

If a first bit line separation signal BISH is enabled, the first switch 40 connects the bit line BL and the sense amplifier 30 to each other. The first switch 40 includes a third transistor N3. The first bit line separation signal BISH is inputted to a gate of the third transistor N3, the bit line BL is connected to a drain of the third transistor N3, and the sense amplifier 30 is connected to a source of the third transistor N3.

If a second bit line separation signal BISL is enabled, the second switch 50 connects the bit line bar BLb and the sense amplifier 30 to each other. The second switch 50 includes a fourth transistor N4. The second bit line separation signal BISL is inputted to a gate of the fourth transistor N4, the bit line bar BLb is connected to a drain of the fourth transistor N4, and the sense amplifier 30 is connected to a is source of the fourth transistor N4.

A refresh operation of the semiconductor memory apparatus configured as described above will be described.

In the refresh operation, the first word line WL0 is enabled so that a voltage level of the first memory cell 11 is provided to the bit line BL.

If the first word line WL0 is enabled, both the first and second bit line separation signals BISH and BISL are disabled at a predetermined time. That is, the first and second bit line separation signals BISH and BISL are disabled so that the loading of the bit line BL and the bit line bar BLb is reduced by separating the bit line BL and the bit line bare BLb from the sense amplifier 30.

If the first and second bit line separation signals BISH and BISL are enabled, the bit line BL and the bit line bar BLb are connected to the sense amplifier 30. In this case, a sense amplifier enable signal SA_en is enabled, and the sense amplifier 30 is activated.

The activated sense amplifier 30 amplifies the bit line BL and the bit line bar BLb respectively to a core voltage Vcore (not shown) and a ground voltage VSS (not shown). In this case, the operation voltage of the sense amplifier 30 has the core voltage Vcore and the ground voltage VSS.

The sense amplifier 30 amplifies one of the bit line BL and the bit line bar BLb to the core voltage Vcore, and amplifies the other of the bit line BL and the bit line bar BLb to the ground voltage VSS. For example, the bit line BL is amplified to a level of the core voltage Vcore, and the bit line bar BLb is amplified to a level of the ground voltage VSS. In this case, the bit line bar BLb amplified to the level of the ground voltage VSS is amplified faster than the bit line BL amplified to the level of the core voltage Vcore.

Although the bit line bar BLb is amplified faster than the bit line BL, the bit line bar BLb is amplified for the same time as the bit line BL, and therefore, the current consumption of the bit line bar BLb increases.

Figure 3:
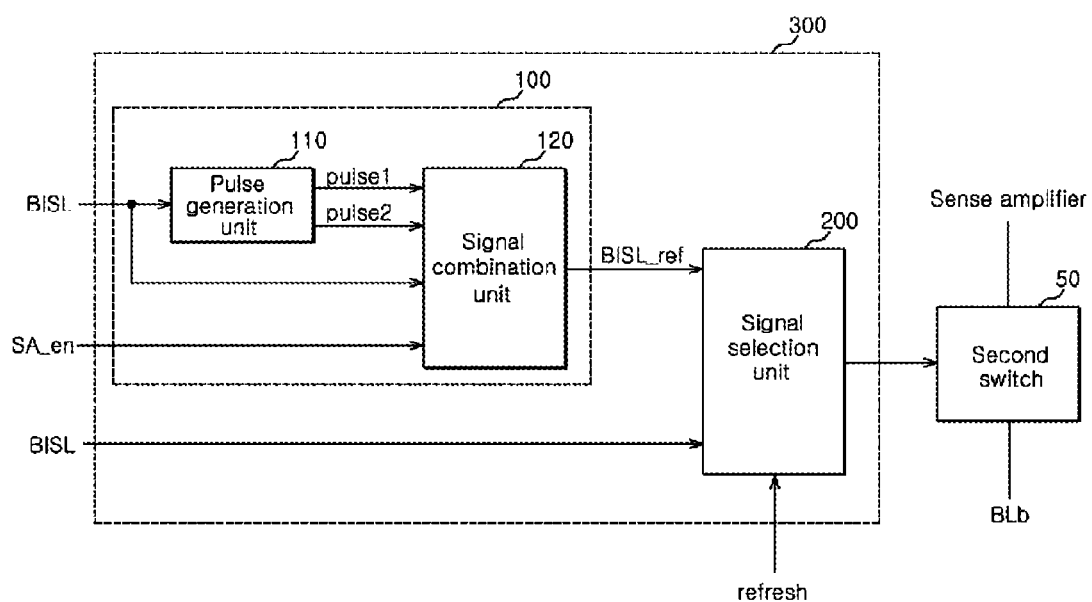
FIG. 3 is a configuration diagram of a control unit according to an embodiment of the present invention.

A semiconductor memory apparatus according to an embodiment of the present invention includes a first mat 10, a second mat 20, a sense amplifier 30, a first switch 40 and a second switch 50, as illustrated in FIG. 1, and further includes a control unit 300 as illustrated in FIG. 3 for providing a signal to the second switch 50.

The first mat 10 includes a first memory cell 11 for storing data. The first memory cell 11 includes a first transistor N1 and a first capacitor C1. A first word line WL0 is coupled to a gate of the first transistor N1, a bit line BL is coupled to a drain of the first transistor N1, and one end of the first capacitor C1 is coupled to a source of the first transistor N1. A cell plate voltage VCP is applied to the other end of the first capacitor C1. In this case, the first mat 10 may include a plurality of memory cells.

The second mat 20 includes a second memory cell 21 for storing data. The second memory cell 21 includes a second transistor N2 and a second capacitor C2. A second word line WL1 is coupled to a gate of the second transistor N2, a bit line bar BLb is coupled to a source of the second transistor N2, and one end of the second capacitor C2 is coupled to a source of the second transistor N2. The cell plate voltage VCP is applied to the other end of the second capacitor C2. In this case, the second mat can include a plurality of memory cells.

The sense amplifier 30 senses and amplifies voltage levels of the bit line BL and the bit line bar BLb.

If a first bit line separation signal BISH is enabled, the first switch 40 couples the bit line BL and the sense amplifier 30 to each other. The first switch 40 includes a third transistor N3. The first bit line separation signal BISH is inputted to a gate of the third transistor N3, the bit line BL is coupled to a drain of the third transistor N3, and the sense amplifier 30 is coupled to a source of the third transistor N3.

The second switch 50 couples and separates the bit line bar BLb and the sense amplifier 30 to and from each other in response to an output of the control unit 300. The second switch 50 includes a fourth transistor N4. The output of the control unit 300 is inputted to a gate of the fourth transistor N4, the bit line bar BLb is coupled to a drain of the fourth transistor N4, and the sense amplifier 30 is coupled to a source of the fourth transistor N4.

In a refresh operation, the control unit 300 couples one of the bit line BL and the bit line bar BLb to the sense amplifier 30 during a period when the sense amplifier 30 is activated, and couples the other of the bit line BL and the bit line bar BLb to the sense amplifier 30 during a period shorter than the period when the sense amplifier 30 is activated. For example, in the refresh operation, the control unit 300 disables a bit line separation signal BISL_ref for the refresh operation from the time when the first word line WL0 is enabled to the time when a sense amplifier enable signal SA_en is enabled. If the sense amplifier enable signal SA_en is enabled, the control unit 300 enables the bit line separation signal BISL_ref for the refresh operation, and disables the enabled bit line separation signal BISL_ref for the refresh operation after a predetermined time elapses. If the sense amplifier enable signal SA_en is disabled, the control unit 300 enables the bit line separation signal BISL_ref for the refresh operation. That is, the control unit 300 provides the bit line separation signal BISL_ref for the refresh operation to the second switch 50 in the refresh operation, and provides a second bit line separation signal BISL to the second switch 50 in a non-refresh operation. Therefore, in the refresh operation, the control unit 300 provides, to the second switch 50, the bit line separation signal BISL_ref for the refresh operation, of which enable period is shorter than that of the second bit line separation signal BISL. In the non-refresh operation, the first and second bit line separation signals BISH and BISL are signals which are disabled when the first word line WL0 is enabled, and enabled when the sense amplifier enable signal SA_en is enabled.

The control unit 300 includes a bit line separation signal generation unit 100 and a signal selection unit 200. Here, the bit line separation signal generation unit 100 may be configured for performing the refresh operation.

In the refresh operation, the bit line separation signal generation unit 100 disables the bit line separation signal BISL_ref for the refresh operation from the time when the first word line WL0 is enabled to the time when the sense amplifier enable signal SA_en is enabled. If the sense amplifier enable signal SA_en is enabled, the bit line separation signal generation unit 100 enables the bit line separation signal BISL_ref for the refresh operation, and disables the enabled bit line separation signal BISL_ref for the refresh operation after a predetermined time elapses. If the sense amplifier enable signal SA_en is disabled, the bit line separation signal generation unit 100 enables the bit line separation signal BISL_ref for the refresh operation.

The signal selection unit 200 provides the bit line separation signal BISL_ref for the refresh operation to the second switch 50, and provides the second bit line separation signal BISL to the second switch 50 in the non-refresh operation.

The signal selection unit 200 may be implemented as a multiplexer. If a refresh signal Refresh is enabled, the signal selection unit 200 provides the bit line separation signal BISL_ref for the refresh operation to the second switch 50. If the refresh signal Refresh is disabled, the signal selection unit 200 provides the second bit line separation signal BISL to the second switch 50.

Figure 4:
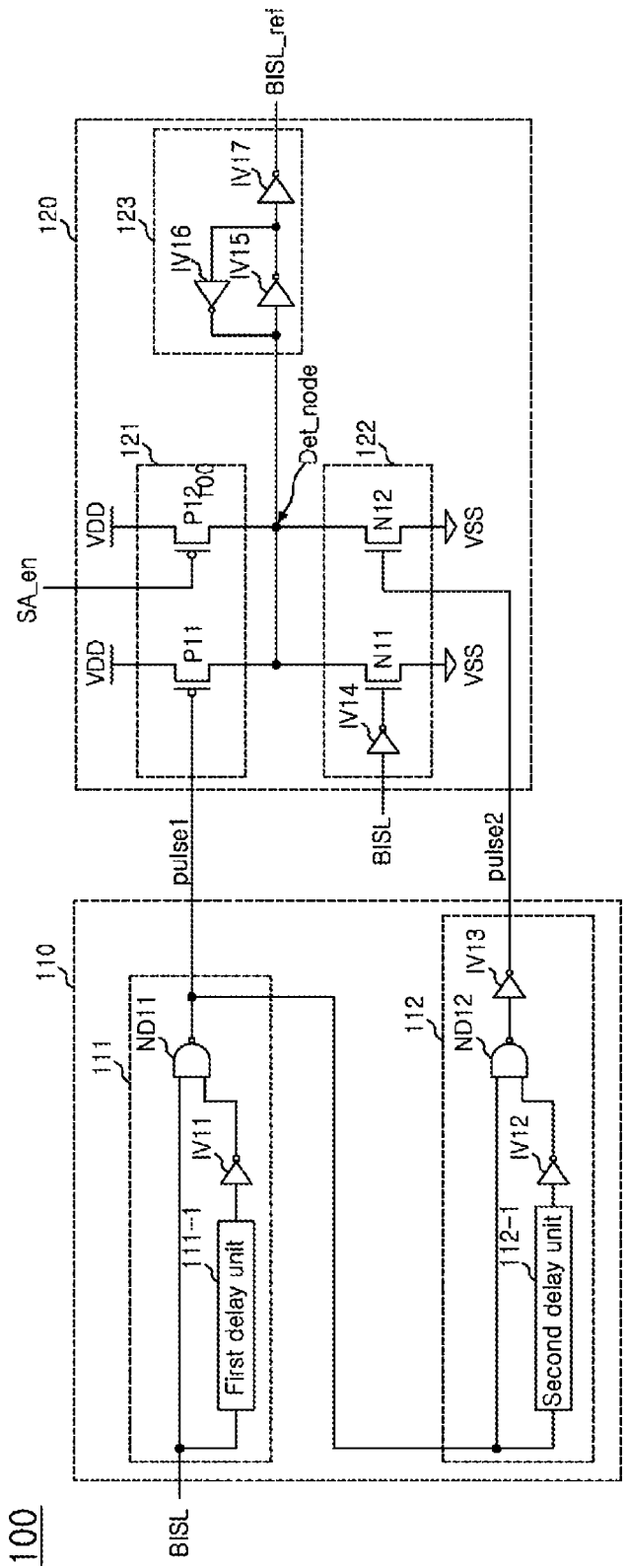
FIG. 4 is a configuration diagram of a bit line separation signal generation unit for refresh, illustrated in FIG. 3.

As illustrated in FIG. 4, the bit line separation signal generation unit 100 includes a pulse generation unit 110 and a signal combination unit 120.

If the sense amplifier enable signal SA_en is enabled, the pulse generation unit 110 generates a first pulse pulse1, and generates a second pulse pulse2 after a predetermined time elapses. For example, the pulse generation unit 110 generates the first pulse pulse1 to be enabled if the sense amplifier enable signal SA_en is enabled and generates the second pulse pulse2 if the sense amplifier enable signal SA_en is disabled. The enable timing of the sense amplifier enable signal SA_en is identical to that of the first and second bit line separation signals BISH and BISL. Therefore, the pulse generation unit 110 constituting the bit line separation signal generation unit 100 according to an embodiment of the present invention uses the second bit line separation signal BISL. It will be understood as a simple design modification by those skilled in the art that the bit line separation signal generation unit 100 uses not only the second bit line separation signal BISL but also a signal enabled at the timing identical to the enable timing of the sense amplifier enable signal SA_en.

The pulse generation unit 110 generates the first and second pulses pulse1 and pulse2 in response to the second bit line separation signal BISL. For example, if the second bit line separation signal BISL is enabled, the pulse generation unit 110 generates the first pulse pulse1. The pulse generation unit 110 generates the second pulse pulse2 enabled at the timing when the first pulse pulse1 is disabled. That is, the pulse generation unit 110 generates the second pulse pulse2 at the time when the enable period of the first pulse pulse1 is ended.

The pulse generation unit 110 includes first and second rising edge pulse generation units 111 and 112.

The first rising edge pulse generation unit 111 generates the first pulse pulse1 enabled to a low level at the timing when the second bit line separation signal BISL is enabled to a high level.

The first rising edge pulse generation unit 111 includes a first delay unit 111-1, a first inverter IV11 and a first NAND gate ND11. The first delay unit 111-1 receives the second bit line separation signal BISL. The first inverter IV11 receives an output signal of the first delay unit 111-1. The first NAND gate ND11 receives the second bit line separation signal BISL and an output signal of the first inverter IV11 so as to generate the first pulse pulse1.

The second rising edge pulse generation unit 112 generates the second pulse pulse2 when the first pulse pulse1 is disabled to the high level.

The second rising edge pulse generation unit 112 includes a second delay unit 112-1, second and third inverters IV12 and IV13 and a second NAND gate ND12. The second delay unit 112-1 receives the first pulse pulse1. The second inverter IV12 receives an output signal of the second delay unit 112-1. The second NAND gate ND12 receives the first pulse pulse1 and an output signal of the second inverter IV12. The third inverter IV13 receives an output signal of the second NAND gate ND12 so as to generate the second pulse pulse2.

The signal combination unit 120 receives the second bit line separation signal BISL, the first and second pulses pulse1 and pulse2 and the sense amplifier enable signal SA_en. For example, if the second bit line separation signal BISL is disabled to the low level, the signal combination unit 120 disables the bit line separation signal BISL_ref for the refresh operation to a low level. If the first pulse pulse1 is enabled to the low level, the signal combination unit 120 enables the bit line separation signal BISL_ref for the refresh operation to the high level. If the second pulse pulse1 is enabled to the high level, the signal combination unit 120 disables the bit line separation signal BISL_ref for the refresh operation to the low level. If the sense amplifier enable signal SA_en is disabled to the low level, the signal combination unit 120 enables the bit line separation signal BISL_ref for the refresh operation to the high level.

The signal combination unit 120 includes a pull-up unit 121, a pull-down unit 122 and a latch unit 123.

The pull-up unit 121 pulls up a detection node Det_node in response to the first pulse pulse1 and the sense amplifier enable signal SA_en. For example, if the first pulse pulse1 is enabled to the low level, the pull-up unit 121 pulls up the detection node Det_node. If the sense amplifier enable signal SA_en is disabled to the low level, the pull-up unit 121 pulls up the detection node Det_node.

The pull-up unit 121 includes third and fourth transistors P11 and P12. The first pulse pulse1 is inputted to a gate of the third transistor P11, an external voltage VDD is applied to a source of the third transistor P11, and the detection node Det_node is coupled to a drain of the third transistor P11. The sense amplifier enable signal SA_en is inputted to a gate of the fourth transistor P12, the external voltage VDD is applied to a source of the fourth transistor P12, and the detection node Det_node is coupled to a drain of the fourth transistor P12.

The pull-down unit 122 pulls down the detection node Det_node in response to the second pulse pulse2 and the second bit line separation signal BISL. For example, if the second pulse pulse2 is enabled to the high level, the pull-down unit 122 pulls down the detection node Det_node. If the second bit line separation signal BISL is disabled to the low level, the pull-down unit 122 pulls down the detection node Det_node.

The pull-down unit 122 includes a fourth inverter IV14 and fifth and sixth transistors N11 and N12. The fourth inverter IV14 receives the second bit line separation signal BISL. An output signal of the fourth inverter IV14 is inputted to a gate of the fifth transistor N11, the detection node Det_node is coupled to a drain of the fifth transistor N11, and a ground terminal VSS is coupled to a source of the fifth transistor N11. The second pulse pulse2 is inputted to a gate of the sixth transistor N12, the detection node Det_node of the sixth transistor N12, and the ground terminal VSS is coupled to a source of the sixth transistor N12.

The latch unit 123 generates the bit line separation signal BISL_ref for the refresh operation according to the level of the detection node Det_node. For example, if the detection node Det_node is pulled up, the latch unit 123 enables the bit line separation signal BISL_ref for the refresh operation to the high level. If the detection node Det_node is pulled down, the latch unit 123 disables the bit line separation signal BISL_ref for the refresh operation to the low level.

An operation of the semiconductor memory apparatus according to an embodiment of the present invention configured as described above will be described with reference to timing diagrams of FIGS. 1, 3 and 5.

It is assumed that the first mat 10 is refreshed. Further, it is assumed that high-level data is stored in the first memory cell of the first mat 10.

The first word line WL0 is enabled so as to perform a refresh operation of the first mat 10. In this case, the first word line WL0 is enabled, so that high-level data of the first memory cell 11 of the first mat 10 is provided to a first bit line BL.

If the first word line WL0 is enabled, the first and second bit line separation signals BISH and BISL are disabled to the low level. In the refresh operation, the bit line separation signal BISL_ref for the refresh operation, inputted to the second switch 50 in place of the second bit line separation signal BISL, is also disabled at the timing when the second bit line separation signal BISL is disabled. That is, when data of the first memory cell 11 is provided to the first bit line BL, in order to reduce loading of the first bit line BL, the first bit line separation signal BISH and the bit line separation signal BISL_ref for the refresh operation are disabled so that the first and second bit lines BL and BLb are separated from the sense amplifier 30.

After the data of the first memory cell 11 is provided to the first bit line BL, i.e., after the first and second bit line separation signals BISH and BISL are enabled to the high level, the sense amplifier enable signal SA_en is enabled so that the sense amplifier 30 is activated. A first pulse pulse1 is generated at the timing when the second bit line separation signal BISL is enabled to the high level. If the first pulse pulse1 is generated, the bit line separation signal BISL_ref for the refresh operation is enabled to the high level so that the second switch 50 is coupled to the sense amplifier 30. That is, the first pulse pulse1 is generated at the timing when the sense amplifier enable signal SA_en is enabled. If the first pulse pulse1 is generated, the bit line separation signal BISL_ref for the refresh operation is enabled to the high level so that the second switch 50 and the sense amplifier 30 are coupled to each other.

The activated sense amplifier 30 senses and amplifies a difference in voltage level between the first and second bit lines BL and BLb. In this case, the voltage level of the first bit line BL is increased, and the voltage level of the second bit line BLb is decreased.

The second bit line separation signal BISL is enabled to the high level, i.e., the sense amplifier enable signal SA_en is enabled, and a second pulse pulse2 is generated after a predetermined time elapses. For example, the second pulse pulse2 is generated at the timing when the first pulse pulse1 is enabled and then disabled.

If the second pulse pulse2 is generated, the bit line separation signal BISL_ref for the refresh operation is disabled. If the bit line separation signal BISL_ref for the refresh operation is disabled to the low level in the refresh operation, the sense amplifier 30 and the second bit line BLb are separated from each other.

If the voltage level of the second bit line BLb, which is decreased by the activated sense amplifier 30, is not decreased any more, and only the voltage level of the first bit line BL coupled to the sense amplifier 30 is increased. For example, the first bit line BL is increased from the level of a voltage bit line precharge (VBLP=1/2Vcore) to the level of a core voltage Vcore, and the second bit line BLb has a level which lower than that of the voltage bit line precharge VBLP and higher than that of the ground voltage VSS.

Thus, the sense amplifier 30 does not decrease the voltage level of the second bit line BLb to the level of the ground voltage VSS, so that the current consumption of the sense amplifier 30 is reduced in the refresh operation.

As described above, according to the embodiments of the present invention, the operating current consumption of the sense amplifier is reduced in a refresh operation, so that it is possible to reduce the current consumption of semiconductor memory apparatus that performs the refresh operation. Further, since the delay time of the first delay unit 111-1 of FIG. 4 is a time when the second bit lined and the sense amplifier are coupled to each other, the voltage level of the second bit line in the refresh operation can be controlled by adjusting the delay time of the first delay unit 111-1.

Meanwhile, the present invention is an invention which can be used not only in semiconductor memory fields but also in circuits using semiconductors. That is, it can be construed that the present invention includes a line (bit line) for transmitting a signal, an amplification unit (sense amplifier) for sensing and amplifying an input voltage during an enable period of an enable signal (sense amplifier enable signal), a switch for inputting a voltage of the line as the input voltage to the amplification unit when a control signal (bit line separation signal) is enabled and preventing the voltage of the line from being inputted to the amplification unit when the control signal is disabled, and a control unit for enabling the control signal when the enable signal is enabled in a specific operation mode (refresh operation mode) and generating the control signal of which enable period is shorter than that of the enable signal. In this case, the control unit generates the control signal of which enable period is identical to that of the enable signal in a non-specific operation mode (non-refresh operation mode).

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A semiconductor memory apparatus, comprising:
   a first switch configured to connect/separate a first bit line and a sense amplifier to/from each other in response to a first bit line separation signal;
   a second switch configured to couple a second bit line and the sense amplifier to each other in response to a second bit line separation signal or a bit line separation signal for a refresh operation; and
   a control unit configured to generate the bit line separation signal for the refresh operation, of which enable period is shorter than that of the second bit line separation signal, and provide the generated bit line separation signal for the refresh operation to the second switch in a refresh operation,
   wherein the control unit generates the second bit line separation signal in a non-refresh operation.

2. The semiconductor memory apparatus according to claim 1, wherein the voltage level of the second bit line decreases to a first level higher than a ground voltage in the refresh operation.

3. The semiconductor memory apparatus according to claim 1, wherein the first bit line is a bit line and the second bit line is a bit line bar.

4. The semiconductor memory apparatus according to claim 1, wherein, in the non-refresh operation, the first and second bit line separation signals are signals which are disabled when a word line is enabled and enabled when a sense amplifier enable signal is enabled.

5. The semiconductor memory apparatus according to claim 4, wherein, in the refresh operation, the control unit provides the bit line separation signal for the refresh operation to the second switch by disabling the bit line separation signal for the refresh operation when the second bit line separation signal is disabled, enabling the bit line separation signal for the refresh operation and then disabling the bit line separation signal for the refresh operation after a predetermined time when the second bit line separation signal is enabled, and enabling the bit line separation signal for the refresh operation when the sense amplifier enable signal is disabled.

6. The semiconductor memory apparatus according to claim 5, wherein the control unit comprises:
 a pulse generation unit configured to generate a first pulse when the second bit line separation signal is enabled, and generate a second pulse when a predetermined time elapses after the first pulse is generated;
 a signal combination unit configured to generate the bit line separation signal for the refresh operation in response to the second bit line separation signal, the first and second pulses and the sense amplifier enable signal; and
 a signal selection unit configured to provide the second bit line separation signal or the bit line separation signal for the refresh operation to the second switch in response to a refresh signal.

7. The semiconductor memory apparatus according to claim 6, wherein the signal combination unit disables the bit line separation signal for the refresh operation when the second bit line separation signal is disabled, enables the bit line separation signal for the refresh operation when the first pulse is generated, disables the bit line separation signal for the refresh operation when the second pulse is generated, and enables the bit line separation signal for the refresh operation when the sense amplifier enable signal is disabled.

8. A semiconductor memory apparatus, comprising:
 a bit line;
 a bit line bar;
 a sense amplifier; and
 a control unit configured to couple one selected from the bit line and the bit line bar to the sense amplifier during a period when the sense amplifier is activated, and couple the other selected from the bit line and the bit line bar to the sense amplifier during a period shorter than that when the sense amplifier is activated, in a refresh operation,
 wherein the control unit is configured to couple the bit line and the bit line bar to the sense amplifier during a same period when the sense amplifier is activated, in a non-refresh operation.

9. The semiconductor memory apparatus according to claim 8, wherein the voltage level of the bit line bar decreases to a first level higher than a ground voltage in the refresh operation.

10. The semiconductor memory apparatus according to claim 8, wherein, in a non-refresh operation, the control unit couples the bit line and the bit line bar to the sense amplifier during an activation period of the sense amplifier.

11. The semiconductor memory apparatus according to claim 10, wherein the control unit separates the sense amplifier and the bit line bar from each other until a word line is enabled and the sense amplifier is activated, couples the sense amplifier and the bit line to each other for a predetermined time when the sense amplifier is activated, separates the sense amplifier and the bit line bar from each other after the predetermined time elapses, and couples the sense amplifier and the bit line bar to each other when the sense amplifier is non-activated.

12. The semiconductor memory apparatus according to claim 11, further comprising a switch configured to connect/separate the bit line bar and the sense amplifier to/from each other in response to a bit line signal.

13. The semiconductor memory apparatus according to claim 12, wherein the control unit disables the bit line separation signal so as to separate the sense amplifier and the bit line bar from each other until the word line is enabled and the sense amplifier is activated, enables the bit line separation signal so as to couple the sense amplifier and the bit line to each other for a predetermined time when the sense amplifier is activated, disables the bit line separation signal so as to separate the sense amplifier and the bit line bar from each other after the predetermined time elapses, and enables the bit line separation signal so as to couple the sense amplifier and the bit line bar to each other when the sense amplifier is non-activated.

14. The semiconductor memory apparatus according to claim 13, wherein the control unit comprises:
 a pulse generation unit configured to generate a first pulse when a sense amplifier enable signal is enabled, and generate a second pulse when a predetermined time elapses after the first pulse is generated; and
 a signal combination unit configured to disable the bit line separation signal when the word line is enabled, enable the bit line separation signal when the first pulse is generated, disable the bit line separation signal when the second pulse is generated, and enable the bit line separation signal when the sense amplifier enable signal is disabled.

15. A semiconductor memory apparatus, comprising:
 a first bit line configured to provide data of a first mat when a first word line is enabled;
 a second bit line configured to provide data of a second mat when a second word line is enabled;
 a sense amplifier configured to sense and amplify voltage levels of the first and second bit lines in response to a sense amplifier enable signal;
 a first switch configured to couple the first bit line and the sense amplifier to each other when a first bit line separation signal is enabled;
 a second switch configured to couple the second bit line and the sense amplifier to each other when a second bit line separation signal is enabled; and
 a control unit configured to disable the first and second bit line separation signals until the first word line is enabled and the sense amplifier enable signal is enabled, enable the first and second bit line separation signals when the sense amplifier enable signal is enabled, disable the enabled second bit line separation signal after a predetermined time elapses, and enable the second bit line separation signal when the sense amplifier enable signal is disabled, in a refresh operation.

16. The semiconductor memory apparatus according to claim 15, wherein, in a non-refresh operation, the first and second bit line separation signals are disabled when the first word line is enabled, and the first and second bit line separation signals are enabled when the sense amplifier enable signal is enabled.

17. The semiconductor memory apparatus according to claim 16, wherein the control unit disables the second bit line separation signal until the first word line is enabled and the sense amplifier signal is enabled, enables the second bit line separation signal and then disables the second bit line separation signal after a predetermined time when the sense amplifier enable signal is enabled, and enables the second bit line separation signal when the sense amplifier enable signal is disabled.

18. A semiconductor integrated circuit, comprising:
- a line configured to transmit a signal;
- an amplification unit configured to sense and amplify an input voltage during an enable period of an enable signal;
- a switch configured to input a voltage of the line as the input voltage to the amplification unit when a control signal is enabled, and prevent the voltage of the line from being inputted to the amplification unit when the control signal is disabled; and
- a control unit configured to enable the control signal when the enable signal is enabled, and generate the control signal of which enable period is shorter than that of the enable signal, in a specific operation mode,
- wherein the control unit is configured to generate the control signal having an enable period identical to that of the enable signal in a non-specific operation mode.

* * * * *